(12) United States Patent
Son et al.

(10) Patent No.: US 10,725,589 B2
(45) Date of Patent: Jul. 28, 2020

(54) METHOD OF IMPLEMENTING BUTTON CLICK USING CONTROL OF INPUT SIGNAL

(71) Applicant: MPLUS CO., LTD., Suwon-si, Gyeonggi-do (KR)

(72) Inventors: Yeon Ho Son, Suwon-si (KR); Sung Hoon Jung, Suwon-si (KR); Tae Hoon Lee, Suwon-si (KR)

(73) Assignee: MPLUS CO., LTD., Suwon-si, Gyeonggi-Do (KR)

( * ) Notice: Subject to any disclaimer, the term of this patent is extended or adjusted under 35 U.S.C. 154(b) by 137 days.

(21) Appl. No.: 16/106,903

(22) Filed: Aug. 21, 2018

(65) Prior Publication Data

US 2019/0065005 A1 Feb. 28, 2019

(30) Foreign Application Priority Data

Aug. 25, 2017 (KR) .......................... 10-2017-0107772

(51) Int. Cl.
*G06F 3/043* (2006.01)
*H03K 17/94* (2006.01)
*G06F 3/01* (2006.01)

(52) U.S. Cl.
CPC ............ *G06F 3/0433* (2013.01); *G06F 3/016* (2013.01); *H03K 17/94* (2013.01); *H03K 2217/96062* (2013.01)

(58) Field of Classification Search
CPC ....... G06F 3/016; G06F 3/0433; H03K 17/94; H03K 2217/96062
See application file for complete search history.

(56) References Cited

U.S. PATENT DOCUMENTS

| 2007/0183493 | A1* | 8/2007 | Kimpe ................ G06F 21/6245 375/240.1 |
| 2014/0085064 | A1* | 3/2014 | Crawley ............... B06B 1/0246 340/407.1 |
| 2014/0247227 | A1* | 9/2014 | Jiang ..................... G06F 3/0416 345/173 |
| 2015/0070261 | A1* | 3/2015 | Saboune ................ G06F 3/016 345/156 |

FOREIGN PATENT DOCUMENTS

| KR | 10-2011-0127526 A | 11/2011 |
| KR | 10-2014-0109292 A | 9/2014 |
| KR | 10-2016-0030927 A | 3/2016 |

* cited by examiner

*Primary Examiner* — Chun-Nan Lin
(74) *Attorney, Agent, or Firm* — LRK Patent Law Firm

(57) ABSTRACT

A technology for implementing a finer button click of a device including an LRA by reducing the falling time of an LRA after a click is implemented by controlling an input signal applied to the LRA depending on an operating characteristic of the LRA. A user's operational convenience can be improved by omitting a real button positioned in the front part of a mobile phone, and more smooth display watching and manipulation are made possible by increasing the size of a display. Furthermore, the button click of a device including an LRA can be realistically implemented by controlling only the frequency of an input signal without adding a separate device or a control circuit to the LRA.

4 Claims, 3 Drawing Sheets

METHOD OF IMPLEMENTING BUTTON CLICK USING CONTROL OF INPUT SIGNAL

CROSS REFERENCE TO RELATED APPLICATION

The present application claims the benefit of Korean Patent Application No. 10-2017-0107772 filed in the Korean Intellectual Property Office on Aug. 25, 2017, the entire content of which is incorporated herein by reference.

BACKGROUND OF THE INVENTION

1. Technical Field

The present invention relates to a technology for realistically implementing the button click of a device including a linear actuator or linear resonant actuator (hereinafter referred to as an "LRA") by controlling the frequency of an input signal input to the linear actuator (or LRA) and, more particularly, to a technology for implementing a finer button click by reducing the falling time of an LRA after a click is implemented by controlling an input signal depending on an operating characteristic of the LRA.

2. Description of Related Art

The use of a device including a vibration generator (hereinafter referred to as a "vibration device"), such as a mobile phone or a vibration bell, is recently generalized. The development and supply of the vibration device is activated.

In a mobile phone including such a vibration device, there is a need for a technology for improving a user's operational convenience by omitting a real button positioned on the front of the mobile phone and allowing a user to perform more smooth display watching and manipulation by increasing the size of a display.

In order to omit the real button and implement a click on the button through a virtual button on the display as described above, there is a need for an LRA that responds rapidly and accurately in response to an input signal, such as a user's display touch.

In a conventional technology, in order to fabricate an LRA that precisely responds to an input signal, such as a user's display touch, in general, a response control technology for an LRA using a hall sensor or a counter electromotive force is used.

Such a response control technology for the LRA using a hall sensor or a counter electromotive force has problems in that a production process increases and a total production cost rises because a separate hall sensor must be provided within the LRA and a control circuit must be added in order to control the LRA using a counter electromotive force.

Accordingly, there is a need for a technology for realistically implementing the button click of a device including an LRA by controlling only the frequency of an input signal while not adding a separate device or a control circuit to the LRA.

PRIOR ART DOCUMENT

Patent Document (Patent Document 0001) Korean Patent Application Publication No. 10-2011-0127526A

SUMMARY OF THE INVENTION

The present invention has been made keeping in mind the above problems occurring in the prior art, and an object of the present invention is to implement a finer button click by reducing the falling time of an LRA after a click is implemented by controlling the input signal frequency of a device including the LRA in response to a driving characteristic (e.g., resonant frequency) of the LRA.

Furthermore, an object of the present invention is to realistically implement the button click of a device including an LRA by controlling the frequency of an input signal while not adding a separate device or a control circuit to the LRA.

An embodiment of the present invention may provide a method of implementing a button click through control of an input signal frequency, including an input signal application step of applying an AC input signal to a linear resonant actuator (LRA) using resonance, an LRA driving step of driving the LRA in response to the input signal applied to the LRA, an application termination step of terminating the application of the input signal applied to the LRA, and a driving termination step of terminating the driving of the LRA when the application of the input signal is terminated in the application termination step.

In the input signal application step, an AC input signal having a pulse of a sine wave form may be applied to the LRA, an input signal input when a virtual button is clicked may be input 20 ms or less, the phase of the input signal input when the virtual button is clicked may be earlier than the phase of a vibration waveform of the LRA, and the frequency of the input signal input when the virtual button is clicked may be 60 Hz or higher than the resonant frequency of the LRA.

Furthermore, in the input signal application step, the cycle of the input signal when the virtual button is clicked may be is 1.5 cycle or more to 3 cycle or less.

DETAILED DESCRIPTION

Figure 1:
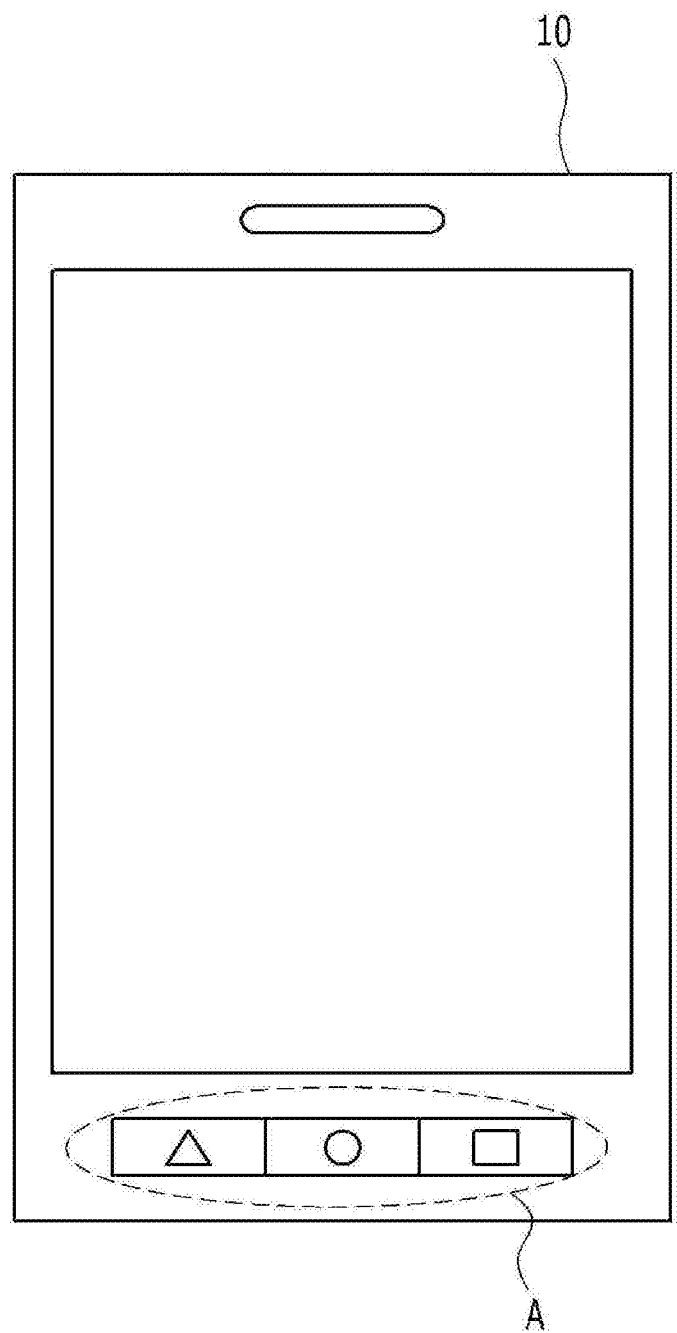
FIG. 1 is a front view of a mobile phone showing an example of a conventional technology.

Hereinafter, some embodiments of the present invention are described in detail with reference to exemplary drawings. It is to be noted that in assigning reference numerals to elements in the drawings, the same reference numerals denote the same elements throughout the drawings even in cases where the elements are shown in different drawings. Furthermore, in describing the embodiments of the present invention, a detailed description of the known functions and constitutions will be omitted if it is deemed to make the gist of the present invention unnecessarily vague.

Furthermore, in describing the elements of the embodiments of the present invention, terms, such as the first, the second, A, B, (a), and (b), may be used. However, although the terms are used only to distinguish one element from the other element, the essence, order, or sequence of the elements is not limited by the terms. When it is said that one element is "connected", "combined", or "coupled" to the other element, the one element may be directly connected or coupled" to the other element, but it should also be understood that a third element may be "connected", "combined", or "coupled" between the two elements.

FIG. 1 is a front view of a mobile phone showing an example of a conventional technology.

In the conventional technology, a real button is positioned around the display unit of a mobile phone, and an interface between a user and a device including a vibration generator is constructed by manipulating the real button.

A method according to such a conventional technology has advantages in that it can improve user recognition and can control the real button intuitively.

However, such a real button has problems in that it has a frequent trouble because an impact or friction between parts essentially occurs and has a limit in terms of use.

Furthermore, there are disadvantages in that the size of a display unit is limited due to the real button positioned below the display unit and the flatness of the front part where the display unit is positioned is deteriorated.

Accordingly, such a real button positioned separately from the display unit in the front part of a device may be omitted, and the function of the omitted real button may be substituted in the display unit.

Figure 2:
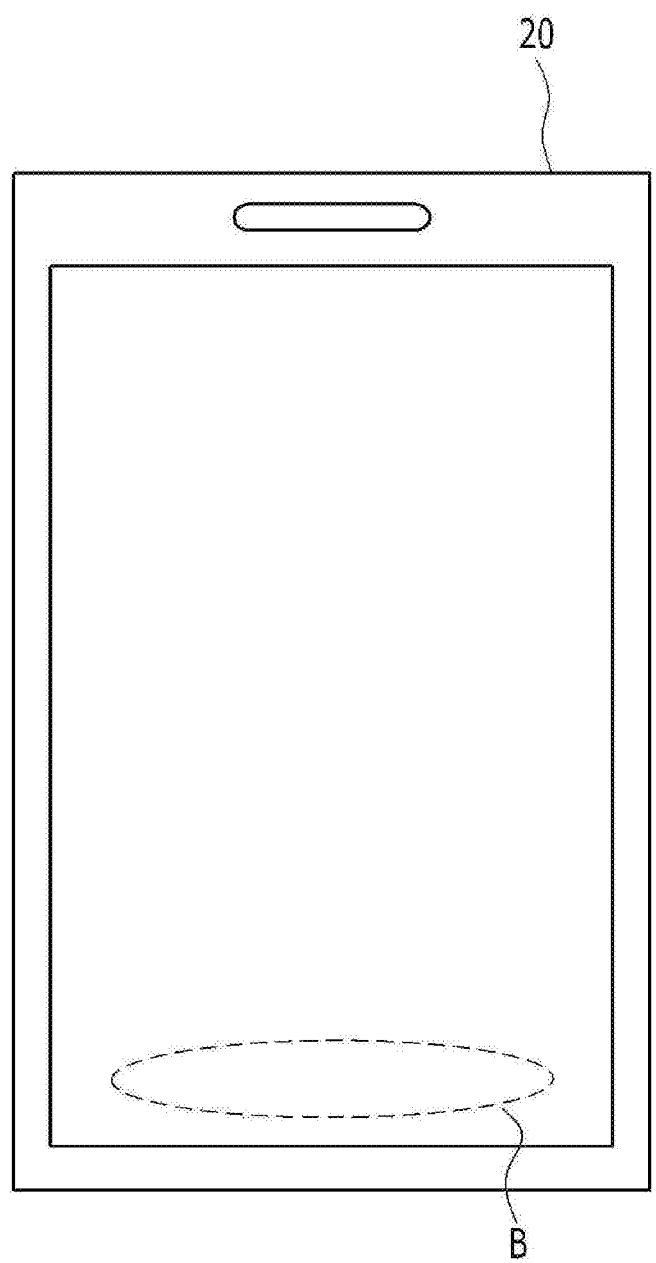
FIG. 2 is a front view of a mobile phone showing an embodiment of the present invention.

FIG. 2 is a front view of a mobile phone showing an embodiment of the present invention.

According to an embodiment of the present invention, the size of a display unit can be extended and a virtual button can be implemented below a display unit by omitting the real button as described above.

Accordingly, the display unit can be used as a further extended size, and a device including a vibration device can be controlled more smoothly by widening a visible area.

In this case, due to the characteristics of the virtual button, a user does not recognize a physical operation when the virtual button operates. Accordingly, there is a need for a system for enabling a user to recognize that operation control through such a virtual button or an interface operation is realized.

In an embodiment of the present invention, in order for a user to recognize that operation control or an interface operation through a virtual button have been realized, a method of reproducing or implementing a feeling of click when a virtual button is clicked by driving an LRA is used.

To realistically reproduce a feeling of click of a real button by precisely controlling the driving of an LRA may be said to be a main object and effect of the present invention.

Figure 3:
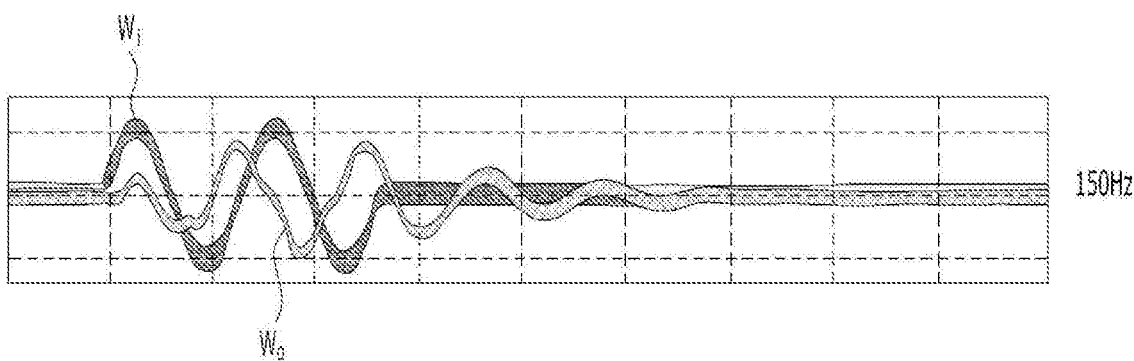
FIG. 3 is a graph showing the driving of an input signal and an LRA when the input signal of 150 Hz is applied to the LRA having a resonant frequency of 170 Hz according to an embodiment of the present invention.

FIG. 3 is a graph showing the driving of an input signal and an LRA when the input signal of 150 Hz is applied to the LRA having a resonant frequency of 170 Hz according to an embodiment of the present invention.

FIG. 3 shows the waveform $W_i$ of an input signal and the vibration waveform $W_o$ of an LRA when the input signal $W_i$ having a frequency less than the resonant frequency of the LRA is applied to the LRA of about two cycles.

Specifically, it may be seen that when an input signal $W_i$ having a frequency less than the resonant frequency (170 Hz) of an LRA is applied, it takes time for the LRA in the stop state to operate by inertia in response to the input signal applied thereto.

Furthermore, it may be seen that the vibration waveform of LRA amplitude rises even after an input signal of one cycle, and the vibration waveform of the LRA continues by inertia even after the application of an input signal of two cycles is terminated to generate the aftersensation of vibration.

Furthermore, after driving, the first half cycle of the vibration waveform generates a displacement due to a pure force not a response according to resonance. The amplitude rises and then falls because power of the input signal to sufficiently generate the displacement is insufficient.

Thereafter, a resonant response appears after the falling process is terminated. As a result, it may be seen that the cycle of substantial initial vibration of the actuator is ahead of the cycle of the input frequency.

If a feeling of a click on a virtual button is implemented by applying an input signal having a frequency smaller than the resonant frequency of an LRA as described above, the time taken for a user to recognize an implemented feeling of click is very long. Furthermore, it is difficult to recognize the end of a click due to subsequent residual vibration after the virtual button is clicked.

Figure 4:
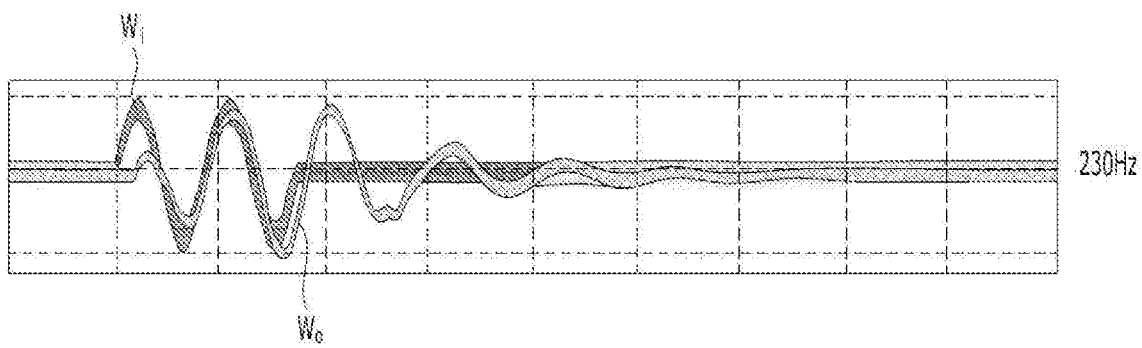
FIG. 4 is a graph showing the driving of an input signal and an LRA when the input signal of 230 Hz is applied to the LRA having a resonant frequency of 170 Hz according to an embodiment of the present invention.

FIG. 4 is a graph showing the driving of an input signal and an LRA when the input signal of 230 Hz is applied to the LRA having a resonant frequency of 170 Hz according to an embodiment of the present invention.

FIG. 4 shows the waveform $W_i$ of an input signal and the vibration waveform $W_o$ of an LRA when the input signal $W_i$ having a frequency slightly higher than the resonant frequency of the LRA is applied to the LRA of about two cycles.

Specifically, it may be seen that when an input signal $W_i$ having a frequency slightly higher than the resonant frequency (170 Hz) of an LRA is applied, it takes time for the LRA in the stop state to operate by inertia in response to the input signal applied thereto.

Furthermore, it may be seen that the cycle of a vibration waveform is performed based on the cycle of an input signal after the input signal of one cycle is applied, the vibration waveform of the LRA continues by inertia even after the application of an input signal of two cycles is terminated to generate the aftersensation of vibration.

Furthermore, after driving, the first half cycle of the vibration waveform generates a displacement due to a pure force not a response according to resonance. The amplitude rises and then falls because power of the input signal to sufficiently generate the displacement is insufficient.

As a result, it may be seen that the cycle of substantial initial vibration of the actuator is the same as the cycle of the input frequency.

As described above, if a feeling of a click on a virtual button is implemented by applying an input signal having a frequency slightly higher than the resonant frequency of an LRA, the time taken for a user to recognize an implemented feeling of click is very long and it is difficult to recognize the end of a click due to residual vibration after the virtual button is clicked.

In order to overcome such problems, there is a need for control for making the cycle of a vibration waveform later than the cycle of an applied input signal due to the influence of inertia of an LRA, the elastic modulus of a spring, etc. by making the frequency of the input signal higher than the resonant frequency of the LRA.

If the cycle of a vibration waveform is later than the cycle of an applied input signal as described above, when the application of the input signal is terminated, the terminated input signal acts to hinder the vibration of the LRA. Accordingly, there is an effect in that the falling time of the LRA is improved.

Figure 5:
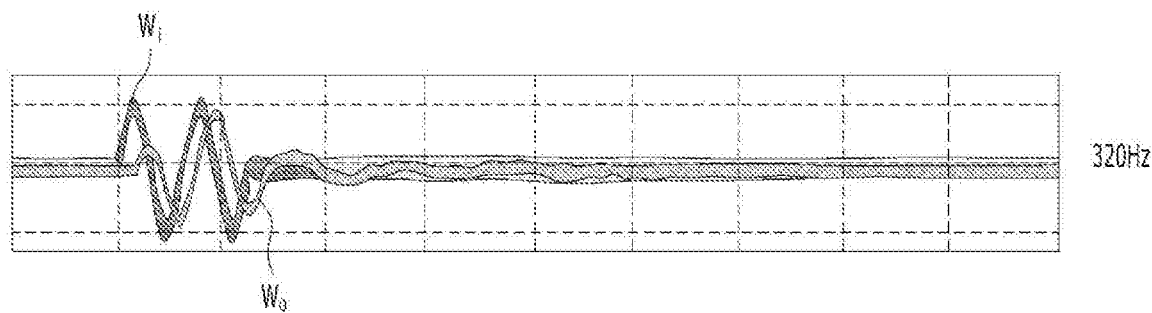
FIG. 5 is a graph showing the driving of an input signal and an LRA when the input signal of 320 Hz is applied to the LRA having a resonant frequency of 170 Hz according to an embodiment of the present invention.

FIG. 5 is a graph showing the driving of an input signal and an LRA when the input signal of 320 Hz is applied to the LRA having a resonant frequency of 170 Hz according to an embodiment of the present invention.

FIG. 5 shows the waveform $W_i$ of an input signal and the vibration waveform $W_o$ of an LRA when the input signal $W_i$ having a frequency more than 150 Hz exceeding the resonant frequency of the LRA is applied to the LRA of about two cycles.

If an input signal $W_i$ having a frequency more than 150 Hz exceeding the resonant frequency (170 Hz) of the LRA is applied as described above, it may be seen that less time is taken for the LRA in the stop state to operate by inertia in response to the applied input signal.

Furthermore, it may be seen that the cycle of a vibration waveform continues later than the cycle of the input signal after an input signal of one cycle is applied, an input signal after the application of an input signal of two cycles is terminated functions as a brake signal, and the vibration waveform of the LRA of two cycles or more continues by inertia to form the aftersensation of vibration.

As a result, it may be seen that the cycle of substantial initial vibration of the actuator is slightly slower than the cycle of the input frequency.

If a feeling of a click on a virtual button is implemented by applying such an input signal having a frequency, there are advantages in that the time taken for a user to recognize an implemented feeling of click can be advanced and a user can recognize a feeling of click within a short time because residual vibration is offset after the virtual button is clicked.

In order to implement this, there is a need for control to make the cycle of a vibration waveform later than the cycle of an applied input signal due to the influence of inertia of an LRA, the elastic modulus of a spring, etc. by making the frequency of the input signal 60 Hz or more the resonant frequency of the LRA.

As in an embodiment of the present invention, if the cycle of a vibration waveform is later than the cycle of an applied input signal, a terminated input signal acts to hinder the vibration of an LRA after the application of the input signal is terminated. Accordingly, there is an effect in that the falling time of the LRA is improved.

The input signal applied to the LRA may be an AC input signal having a pulse of a sine wave form. An input signal when a virtual button is clicked may be input 20 ms or less because a feeling of click on the button commonly has an object of implementing a vibration effect within 10 ms.

Furthermore, a frequency that is 60 Hz or higher than the resonant frequency of an LRA is applied so that the phase of an input signal is faster than that of a vibration waveform as described above. In this case, in order to reproduce a sufficient vibration effect because vibration does not sufficiently occurs during the initial one cycle of an input signal, the cycle of an input signal when a virtual button is clicked may be 1.5 cycle or more to 3 cycle or less.

The embodiment of the present invention has an effect in that it can implement a finer button click because the falling time of an LRA after a click is implemented is reduced by controlling and applying the input signal depending on an operating characteristic of the LRA.

Furthermore, a user's operational convenience can be improved by omitting a real button positioned in the front part of a mobile phone, and more smooth display watching and manipulation are made possible by increasing the size of a display. Furthermore, the button click of a device including an LRA can be realistically implemented by controlling only the frequency of an input signal without adding a separate device or a control circuit to the LRA.

The above description is merely a description of the technical spirit of the present invention, and those skilled in the art may change and modify the present invention in various ways without departing from the essential characteristic of the present invention. Accordingly, the embodiments disclosed in the present invention should not be construed as limiting the technological spirit of the present invention, but should be construed as illustrating the technological spirit of the present invention. The scope of the technological spirit of the present invention is not restricted by the embodiments, and the range of protection of the present invention should be interpreted based on the following appended claims.

Accordingly, the range of protection of the present invention should be construed based on the following claims, and a full technological spirit within an equivalent range thereof should be construed as being included in the scope of right of the present invention.

What is claimed is:

1. A method for simulating a feel of a button click on a mobile device when a virtual button on a touch screen of the mobile device is activated, the method comprising the steps of:
    applying an AC input signal $W_i$ to a linear resonant actuator (LRA) using resonance;
    driving the LRA in response to the input signal $W_i$ applied to the LRA;
    terminating the application of the input signal $W_i$ applied to the LRA; and
    terminating the driving of the LRA when the application of the input signal $W_i$ is terminated in the application termination step,
    wherein a phase of the input signal $W_i$ input when the virtual button is clicked is earlier than a phase of a vibration waveform of the LRA,
    wherein a frequency of the input signal $W_i$ input when the virtual button is clicked is 60 Hz or higher than a resonant frequency of the LRA thereby creating a vibration in the LRA that feels like the button click on the mobile device.

2. The method of claim 1, wherein a frequency of the input signal $W_i$ input when the virtual button is clicked is 150 Hz or higher than a resonant frequency of the LRA.

3. The method of claim 1, wherein the input signal $W_i$ input when the virtual button is clicked is input 20 ms or less.

4. The method of claim 1, wherein a cycle of the input signal $W_i$ input when the virtual button is clicked is 1.5 cycle or more to 3 cycle or less.

* * * * *